United States Patent
Roche et al.

(10) Patent No.: US 7,087,509 B1
(45) Date of Patent: Aug. 8, 2006

(54) METHOD OF FORMING A GATE ELECTRODE ON A SEMICONDUCTOR DEVICE AND A DEVICE INCORPORATING SAME

(75) Inventors: William R. Roche, Beaverton, OR (US); David Donggang Wu, Austin, TX (US); Massud Aminpur, Dresden (DE); Scott D. Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 1241 days.

(21) Appl. No.: 09/676,197

(22) Filed: Sep. 28, 2000

(51) Int. Cl.
*H01L 21/3205* (2006.01)
*H01L 21/4763* (2006.01)

(52) U.S. Cl. .................. 438/595; 438/197; 438/585; 438/669; 438/659; 438/714

(58) Field of Classification Search ................. 438/197, 438/286, 299, 303, 585, 588, 595, 669, 673, 438/658, 659, 713, 714
See application file for complete search history.

(56) References Cited

U.S. PATENT DOCUMENTS

| | | | | | |
|---|---|---|---|---|---|
| 4,561,907 A | * | 12/1985 | Raicu | ................ | 148/DIG. 4 |
| 4,577,391 A | * | 3/1986 | Hsia et al. | ................ | 257/346 |
| 5,472,564 A | * | 12/1995 | Nakamura et al. | ........... | 216/51 |
| 6,087,246 A | * | 7/2000 | Lee | ........................ | 438/199 |
| 6,103,603 A | * | 8/2000 | Han | ........................ | 438/532 |
| 6,309,975 B1 | * | 10/2001 | Wu et al. | .................... | 216/38 |

* cited by examiner

*Primary Examiner*—Amir Zarabian
*Assistant Examiner*—Khanh B. Duong
(74) *Attorney, Agent, or Firm*—Williams, Morgan & Amerson

(57) ABSTRACT

The present invention is directed to a semiconductor device having a gate electrode includes of a plurality of sidewalls, each having a recess formed therein. The present invention is also directed to a method of forming a semiconductor device. In one illustrative embodiment, the method comprises forming a layer of dopant material in a layer of polysilicon and etching the layer of polysilicon to define a gate electrode having a plurality of sidewalls, each of which have a recess formed therein.

20 Claims, 4 Drawing Sheets

METHOD OF FORMING A GATE ELECTRODE ON A SEMICONDUCTOR DEVICE AND A DEVICE INCORPORATING SAME

BACKGROUND OF THE INVENTION

1. Field of the Invention

This invention relates generally to semiconductor fabrication technology, and, more particularly, to a method of forming a gate electrode on a semiconductor device and a device incorporating same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also increases "short-channel" effects, almost by definition, as well as "edge effects" that are relatively unimportant in long channel transistors. Short-channel effects include, among other things, an increased drain-source leakage current when the transistor is supposed to be switched "off." This leakage is believed to be due to an enlarged depletion region relative to the shorter channel length. One of the edge effects that may influence transistor performance is known as Miller capacitance. The Miller capacitance is an overlap capacitance that arises because the conductive gate electrode almost invariably overlaps with a conductive portion of either the more heavily-doped source/drain regions or the less heavily-doped source/drain extension regions, if present, of a conventional transistor.

As shown in FIG. 1, for example, a conventional transistor 10 may be formed on a semiconducting substrate 12, such as doped silicon. The transistor 10 is comprised of a gate electrode 16 formed above a gate oxide 14 that is formed above the surface 13 of the semiconducting substrate 12. The gate electrode 16 and the gate oxide 14 may be separated from doped source/drain regions 18 of the transistor 10 by dielectric spacers 20. The dielectric spacers 20 may be formed above doped source/drain extension regions 19. As shown in FIG. 1, shallow trench isolation regions 25 may be provided to isolate the transistor 10 electrically from neighboring semiconductor devices, such as other transistors (not shown).

The extension regions 19 are typically provided to reduce the magnitude of the maximum channel electric field found close to the source/drain regions 18 of the transistor 10, and, thereby, to reduce the associated hot-carrier effects. The lower (or lighter) doping of the extension regions 19, relative to the doping of source/drain regions 18 of the transistor 10, one typically lower or lighter by at least a factor of two or three, which reduces the magnitude of the maximum channel electric field found close to the doped source/drain regions 18 of the transistor 10, but increases the source-to-drain resistances of the extension regions 19.

As shown in FIG. 1, typically there are overlap regions where the edges 21 of the gate electrode 16 overlap with the edges 23 of the extension regions 19. The typical amount of overlap may be about 200 Å, for example. These overlap regions of the drain region and the gate electrode give rise to the Miller capacitance. As the overall dimensions of the transistor 10 are reduced, the Miller capacitance becomes a more dominant factor, particularly affecting the switching speed of the transistor 10. For example, when the transistor 10 is in an "off" state, there may be some residual charge stored in the overlap regions primarily due to the Miller capacitance. This "Miller charge" must be discharged before the transistor 10 may be switched from the "off" state to an "on" state, slowing down the switching speed. Similarly, the Miller capacitance in the overlap regions must be charged up again with the "Miller charge" after the transistor 10 is switched from the "on" state to the "off" state, further slowing down the switching speed.

The present invention is directed to a method and device that solves or at least reduces some or all of the aforementioned problems.

SUMMARY OF THE INVENTION

The present invention is directed to a semiconductor device having a novel gate electrode structure, and a method of making such a device. In one illustrative embodiment, the method comprises forming a gate dielectric layer above a semiconducting substrate and forming a gate electrode layer above the gate dielectric layer. The method further comprises implanting dopant atoms into the gate electrode layer to define a layer of dopant material in the gate electrode layer, and patterning at least the gate electrode layer to define a gate electrode comprised of a plurality of sidewalls that have a recess formed therein.

In one illustrative embodiment, the present invention is directed to a device comprising a gate dielectric positioned above a semiconducting substrate, a gate electrode positioned above the gate dielectric, the gate electrode having a plurality of sidewalls having a recess formed therein, and a plurality of source/drain regions formed in the substrate.

BRIEF DESCRIPTION OF THE DRAWINGS

The invention may be understood by reference to the following description taken in conjunction with the accompanying drawings, in which like reference numerals identify like elements, and in which.

Figure 1:
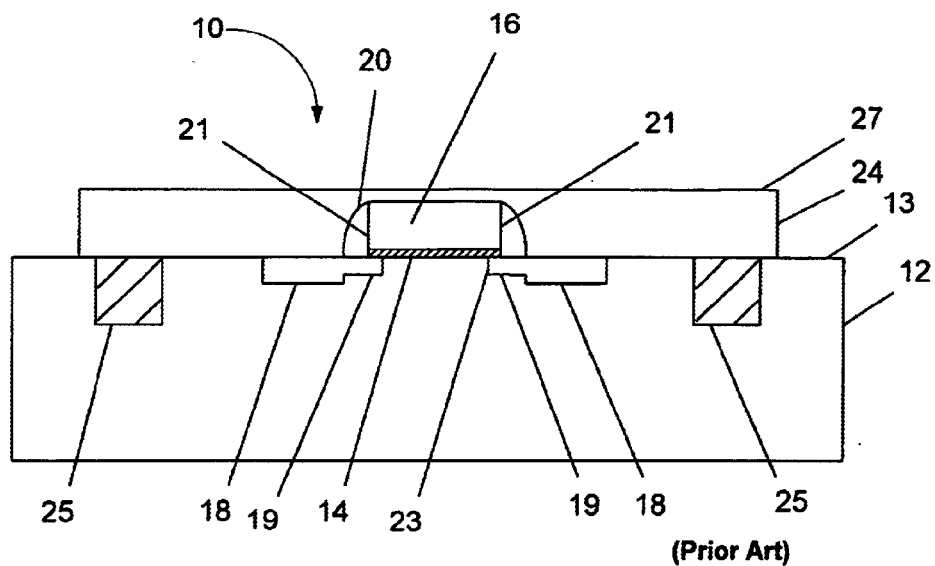
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming a gate electrode on a semiconductor device and to a device incorporating same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
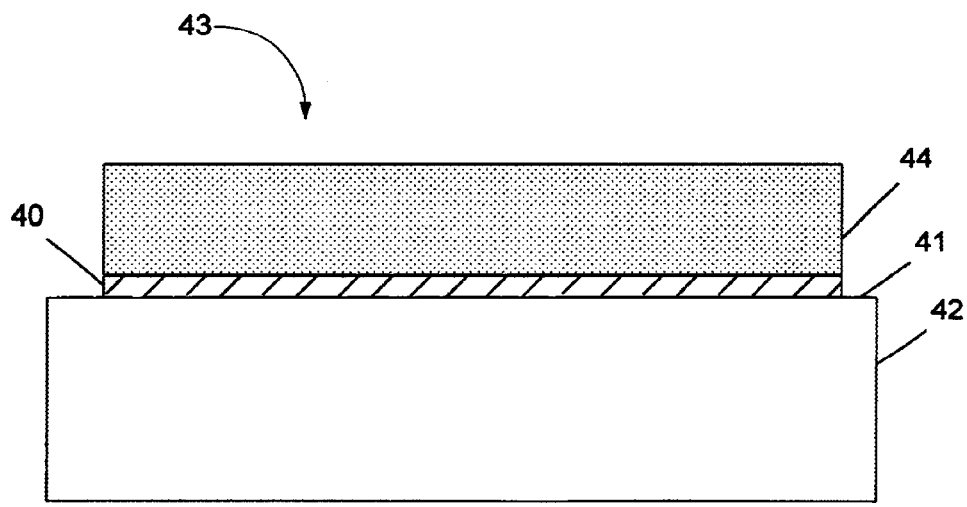
FIG. 2 is a cross-sectional view of a partially formed transistor.

As shown in FIG. 2, a partially formed transistor 43 is comprised of a gate dielectric layer 40 formed above a surface 41 of a semiconducting substrate 42, and a gate electrode layer 44 formed above the gate dielectric layer 40. The various process layers depicted in FIG. 2 may be formed by a variety of known techniques, e.g., thermal growth, chemical vapor deposition ("CVD"), plasma enhanced chemical vapor deposition ("PECVD"), physical vapor deposition ("PVD"), sputtering, etc. Moreover, the various process layers depicted in FIG. 2 may be formed from a variety of materials. Thus, the particular materials of construction, as well as the techniques for forming the process layers depicted in FIG. 2, should not be considered a limitation of the present invention unless specifically recited in the appended claims.

For example, the semiconducting substrate 42 may be comprised of silicon or other semiconducting materials. The gate dielectric layer 40 may be comprised of a variety of materials, such as silicon dioxide, silicon oxynitride, a silicon dioxide/silicon nitride stack, etc. In one illustrative embodiment, the gate dielectric layer 40 is comprised of a thermally grown layer of silicon dioxide having a thickness ranging from approximately 15–30 Å.

The gate electrode layer 44 may also be comprised of a variety of materials, and it may be formed by a variety of techniques. For example, the gate electrode layer 44 may be comprised of polycrystalline silicon (polysilicon) or amorphous silicon. In one illustrative embodiment, the gate electrode layer 44 is comprised of a deposited layer of polysilicon having a thickness ranging from approximately 1800–5000 Å.

Figure 3:
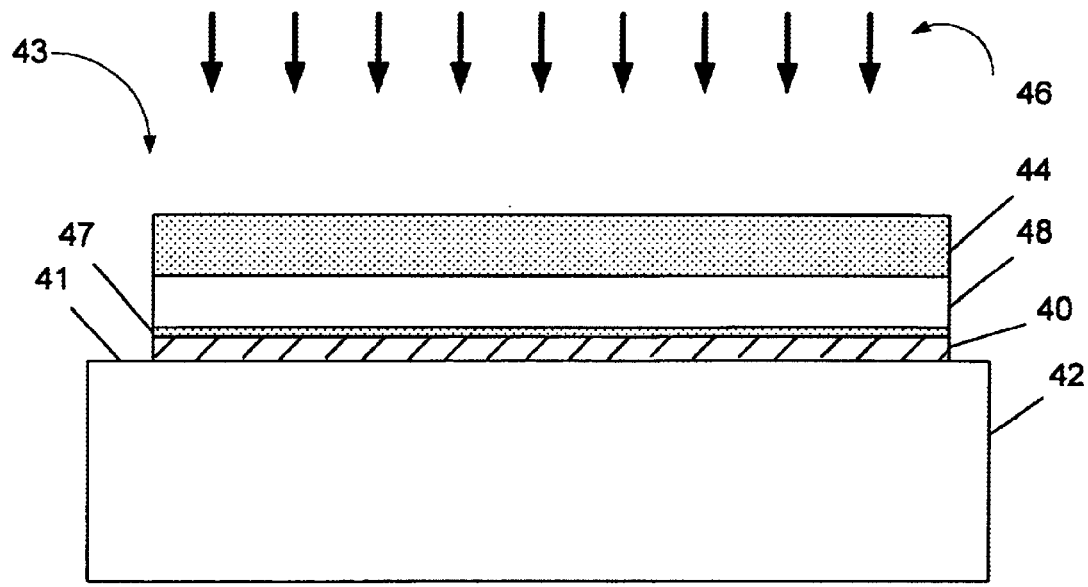
FIG. 3 is the device of FIG. 2 after an implantation process has been performed.

Next, as shown in FIG. 3, the partially formed transistor 43 is subjected to an ion implantation process, as indicated by arrows 46, to form a layer of dopant material 48. Dopants, such as boron, phosphorous, arsenic, nitrogen, antimony, indium, etc. may be used to form the layer of dopant material 48. For example, for NMOS technology, the dopant used to form the layer of dopant material 48 may be arsenic or phosphorous. For PMOS devices, boron may be used.

The energy level and concentration of dopant atoms will vary depending upon the dopant selected to form the layer of dopant material 48 and the desired depth of the implant. In general, the concentration of dopant atoms will range from approximately $5\times10^{14}$–$5\times10^{15}$ atoms per square centimeter. In one illustrative embodiment where the dopant is arsenic, the concentration may vary between $9\times10^{14}$–$4\times10^{15}$ atoms/cm$^2$.

The depth of the layer of dopant material 48 may be varied as a matter of design choice. In general, the layer of dopant material 48 should not be placed so deep that the implanted dopant material may adversely impact the integrity or ability of the gate dielectric layer 40 to perform its intended functions, or to otherwise negatively impact transistor performance. Depending on the particular dopants selected to form the layer of dopant material 48, the distribution or spread of the dopant atoms will vary. For example, all other things being equal, arsenic will have a distribution that is greater than that of phosphorous. Thus, the particular energy used during the ion implantation process will vary depending upon the particular application under consideration. In one illustrative example where arsenic is implanted into a gate electrode comprised of polysilicon, the implant process may be performed at an energy level ranging from approximately 20–50 keV.

In general, the majority of the layer of dopant material 48 should be positioned slightly above the gate dielectric layer 40. Note that in the illustrated situation depicted in FIG. 3, a region 47 of the gate electrode layer 44 is positioned between the layer of dopant material 48 and the gate dielectric layer 40. In practice, the precise boundaries of the region 47, if it exists, will be difficult to define, and it will vary from location to location across the area of the gate electrode layer 44. This is due in part to the nature of the ion implantation process as well as subsequent heating operations that may be performed on the device, which may tend to cause the implanted dopant materials to move.

Nevertheless, the layer of dopant material 48 should be positioned relatively close to the gate dielectric layer 40. Thus, in one illustrative embodiment of the present invention, the region 47 of the gate electrode layer 44 may have a thickness ranging from approximately 50–500 Å. Of course, as stated above, depending upon the particular application and the particular process flow under consideration, the region 47, if it exists at all, may become vanishingly thin, and it may not be uniform across the surface of the gate dielectric layer 40.

Figure 4:
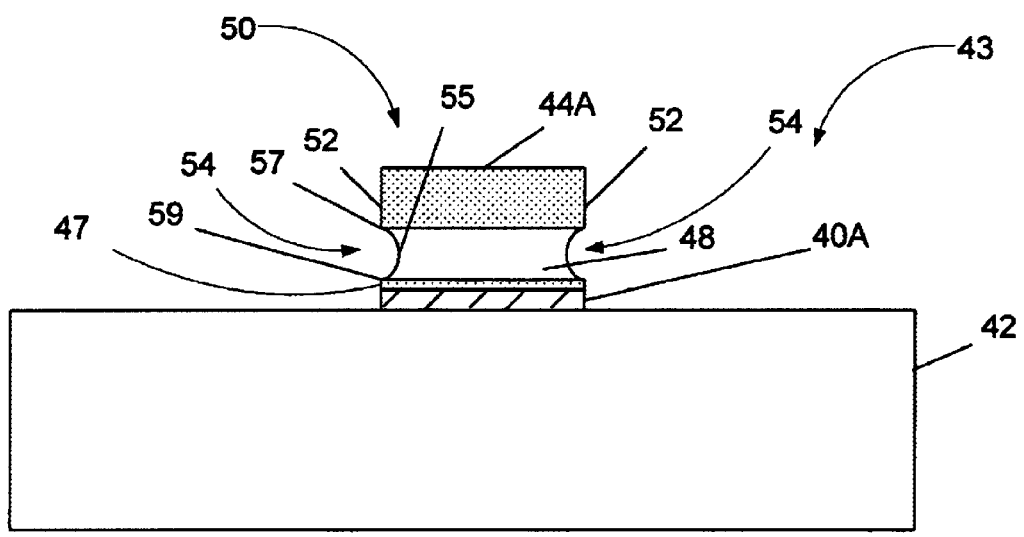
FIG. 4 is a cross-sectional view of the device depicted in FIG. 3 after a patterning operation has been performed.

Next, as shown in FIG. 4, the gate electrode layer 44 and the gate dielectric layer 40 are patterned to define a gate stack 50 comprised of a gate electrode 44A having sides 52 and a gate dielectric layer 40A. This patterning may be accomplished using known photolithography and etching techniques. For example, the etch process may involve an anisotropic plasma etching process. Note that, although it is depicted in FIG. 4 that both the gate electrode layer 44 and gate dielectric layer 40 are removed, that is not necessarily required. For example, portions of the gate dielectric layer 40 extending beyond the sides 52 of the gate electrode 44A may be removed, if at all, in subsequent processing operations.

As seen in FIG. 4, using the present invention, a recessed region 54 is formed in the sides 52 of the gate electrode 44A. This occurs because the etch rate of, for example, polysilicon, is a function of the dopant atoms present in the layer of polysilicon. Thus, by forming the layer of dopant material 48, the portion of the gate electrode 44A having the higher concentration of dopant atoms will etch at a faster rate than other portions of the gate electrode 44. This results in the gate electrode 44A having the recess 54 formed in the sides 52 of the gate electrode 44A. These recesses 54 may extend for the entire width of the gate electrode 44A, i.e., extend into the drawing page, that is in the active region of the device.

The precise size and configuration of the recess 54 will vary depending on a variety of factors, such as the type of dopant atoms implanted, the distribution of the dopant atoms, etc. In general, as an approximation, the recesses 54 may have a shape that roughly corresponds to the concentration profile of the dopant atoms in the layer of dopant material 48, although it may not appear as smooth and precise as the recess 54 depicted in FIG. 5. The wider the distribution profile of the dopant atoms, the wider (in the vertical direction) will be the recess 54. Similarly, the narrower the distribution profile, the narrower (in the vertical direction) will be the recess 54. Additionally, the peak depth of the recesses 54, as indicated by region 55, may vary between approximately 100–300 Å, and the width of the recesses 54, as defined between points 57 and 59, may vary between approximately 500–1000 Å.

Figure 5:
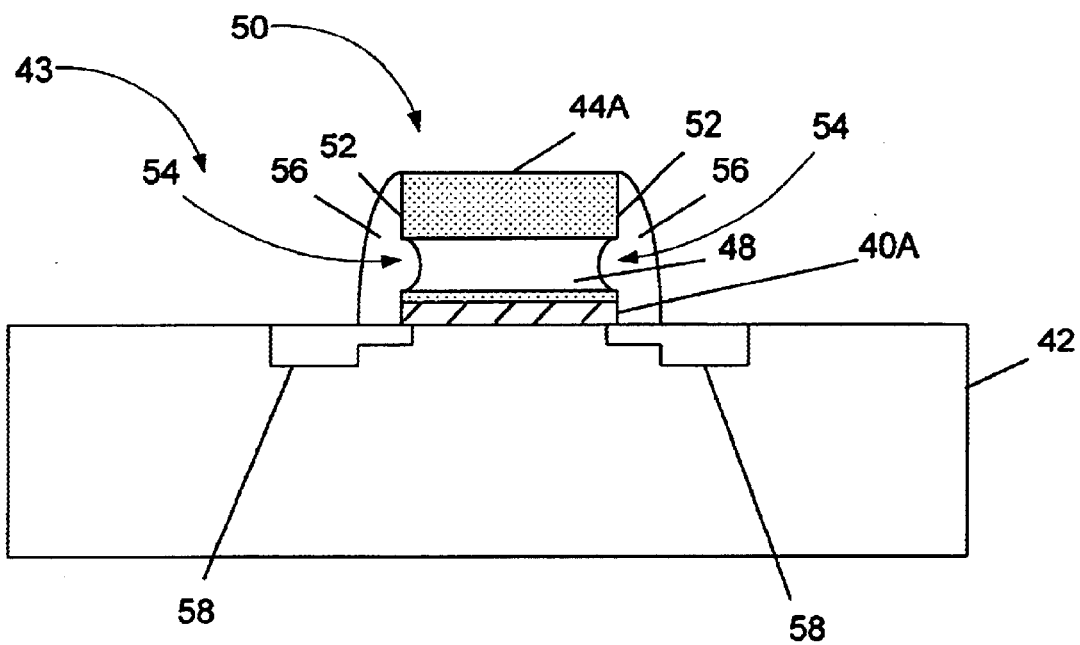
FIG. 5 is a cross-sectional view of the device shown in FIG. 4 after additional processing operations have been performed.
Figure 6:
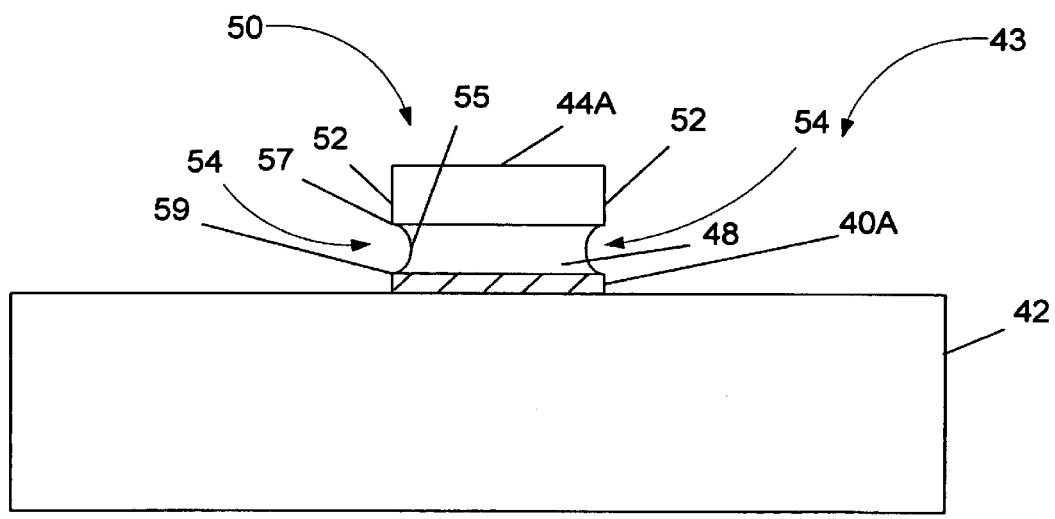
FIG. 6 is a cross-sectional view of an alternative embodiment to the device depicted in FIG. 3 after a patterning operation has been performed.

Next, additional processing operations are performed to complete the formation of the transistor 43. For example, as shown in FIG. 5, sidewall spacers 56 are formed adjacent the gate stack 50 and the source/drain regions 58 are formed in the substrate 42.

The present invention may be used to produce a structure that will assist in reducing the Miller capacitance associated with the device and thereby improve device performance. That is, through use of the present invention, the amount and extent of the overlap between the gate electrode 44A and the source/drain region 58 may be reduced, thereby reducing the Miller capacitance, which may improve device performance.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate dielectric layer above a semiconducting substrate;
   forming a gate electrode layer above said gate dielectric layer;
   implanting dopant atoms into said gate electrode layer to define a layer of dopant material in said gate electrode layer; and
   patterning at least said gate electrode layer to define a gate electrode comprised of a plurality of sidewalls, said sidewalls having a recess formed therein.

2. The method of claim 1, wherein forming a gate dielectric layer above a semiconducting substrate comprises forming a gate dielectric layer comprised of at least one of silicon dioxide and silicon oxynitride above a semiconducting substrate.

3. The method of claim 1, wherein forming a gate dielectric layer above a semiconducting substrate comprises thermally growing a gate dielectric layer comprised of silicon dioxide above a semiconducting substrate.

4. The method of claim 1, wherein forming a gate electrode layer above said gate dielectric layer comprises depositing a gate electrode layer above said gate dielectric layer.

5. The method of claim 1, wherein forming a gate electrode layer above said gate dielectric layer comprises forming a gate electrode layer comprised of at least one of polysilicon and amorphous silicon above said gate dielectric layer.

6. The method of claim 1, wherein implanting dopant atoms into said gate electrode layer to define a layer of dopant material in said gate electrode layer comprises implanting dopant atoms comprised of at least one of boron, phosphorous, arsenic, nitrogen, antimony, and indium into said gate electrode layer to define a layer of dopant material in said gate electrode layer.

7. The method of claim 1, wherein implanting dopant atoms into said gate electrode layer to define a layer of dopant material in said gate electrode layer comprises implanting dopant atoms into said gate electrode layer to define a layer of dopant material in said gate electrode layer, said layer of dopant material being completely separate from said gate dielectric layer.

8. The method of claim 1, wherein implanting dopant atoms into said gate electrode layer to define a layer of dopant material in said gate electrode layer comprises implanting dopant atoms into said gate electrode layer to define a layer of dopant material in said gate electrode layer, said layer of dopant material defining a region of said gate electrode layer that is positioned between said layer of dopant material and said gate dielectric layer.

9. The method of claim 1, wherein, implanting dopant atoms into said gate electrode layer to define a layer of dopant material in said gate electrode layer comprises implanting dopant atoms into said gate electrode layer to define a layer of dopant material in said gate electrode layer, at least a portion of said layer of dopant material being in contact with said gate dielectric layer.

10. The method of claim 1, wherein implanting dopant atoms into said gate electrode layer to define a layer of dopant material in said gate electrode layer comprises implanting dopant atoms at a concentration ranging from approximately $5 \times 10^{14}$–$5 \times 10^{15}$ atoms/cm$^2$ into said gate electrode layer to define a layer of dopant material in said gate electrode layer.

11. The method of claim 1, wherein implanting dopant atoms into said gate electrode layer to define a layer of dopant material in said gate electrode layer comprises implanting dopant atoms at an energy level ranging from approximately 20–500 keV into said gate electrode layer to define a layer of dopant material in said gate electrode layer.

12. The method of claim 1, wherein patterning at least said gate electrode layer to define a gate electrode comprised of a plurality of sidewalls, said sidewalls having a recess formed therein, comprises etching at least said gate electrode layer to define a gate electrode comprised of a plurality of sidewalls, said sidewalls having a recess formed therein.

13. The method of claim 1, wherein patterning at least said gate electrode layer to define a gate electrode comprised of a plurality of sidewalls, said sidewalls having a recess formed therein, comprises performing an anisotropic etching process to pattern at least said gate electrode layer to define a gate electrode comprised of a plurality of sidewalls, said sidewalls having a recess formed therein.

14. A method, comprising:
thermally growing a gate dielectric layer comprised of silicon dioxide above a semiconducting substrate;
depositing a gate electrode layer comprised of polysilicon above said gate dielectric layer;
implanting dopant atoms into said gate electrode layer to define a layer of dopant material in said gate electrode layer; and
performing an anisotropic etching process to pattern at least said gate electrode layer to define a gate electrode comprised of a plurality of sidewalls, said sidewalls having a recess formed therein.

15. The method of claim 14, wherein implanting dopant atoms into said gate electrode layer to define a layer of dopant material in said gate electrode layer comprises implanting dopant atoms comprised of at least one of boron, phosphorous, arsenic, nitrogen, antimony, and indium into said gate electrode layer to define a layer of dopant material in said gate electrode layer.

16. The method of claim 14, wherein implanting dopant atoms into said gate electrode layer to define a layer of dopant material in said gate electrode layer comprises implanting dopant atoms into said gate electrode layer to define a layer of dopant material in said gate electrode layer, said layer of dopant material being completely separate from said gate dielectric layer.

17. The method of claim 14, wherein implanting dopant atoms into said gate electrode layer to define a layer of dopant material in said gate electrode layer comprises implanting dopant atoms into said gate electrode layer to define a layer of dopant material in said gate electrode layer, said layer of dopant material defining a region of said gate electrode layer that is positioned between said layer of dopant material and said gate dielectric layer.

18. The method of claim 14, wherein, implanting dopant atoms into said gate electrode layer to define a layer of dopant material in said gate electrode layer comprises implanting dopant atoms into said gate electrode layer to define a layer of dopant material in said gate electrode layer, at least a portion of said layer of dopant material being in contact with said gate dielectric layer.

19. The method of claim 14, wherein implanting dopant atoms into said gate electrode layer to define a layer of dopant material in said gate electrode layer comprises implanting dopant atoms at a concentration ranging from approximately $5\times10^{14}$–$5\times10^{15}$ atoms/cm$^2$ into said gate electrode layer to define a layer of dopant material in said gate electrode layer.

20. The method of claim 14, wherein implanting dopant atoms into said gate electrode layer to define a layer of dopant material in said gate electrode layer comprises implanting dopant atoms at an energy level ranging from approximately 20–50 keV into said gate electrode layer to define a layer of dopant material in said gate electrode layer.

* * * * *